United States Patent
Kim et al.

(10) Patent No.: US 8,957,432 B2
(45) Date of Patent: Feb. 17, 2015

(54) SEMICONDUCTOR DEVICE

(75) Inventors: Jun-youn Kim, Hwaseong-si (KR);
Young-jo Tak, Hwaseong-si (KR);
Jae-won Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 671 days.

(21) Appl. No.: 13/064,889

(22) Filed: Apr. 25, 2011

(65) Prior Publication Data

US 2011/0266522 A1 Nov. 3, 2011

(30) Foreign Application Priority Data

Apr. 28, 2010 (KR) .................. 10-2010-0039499

(51) Int. Cl.
*H01L 33/26* (2010.01)
*H01L 29/267* (2006.01)
*H01L 21/02* (2006.01)

(52) U.S. Cl.
CPC ........ *H01L 29/267* (2013.01); *H01L 21/02378* (2013.01); *H01L 21/02381* (2013.01); *H01L 21/02458* (2013.01); *H01L 21/02507* (2013.01); *H01L 21/0251* (2013.01); *H01L 21/0254* (2013.01)
USPC .................. 257/94; 257/22; 257/E29.072

(58) Field of Classification Search
CPC .................. H01L 21/02378; H01L 21/02381; H01L 21/02458; H01L 21/02507; H01L 21/0251; H01L 21/0254; H01L 29/267
USPC .................. 257/94, 96–97, 101, 22, E29.072
See application file for complete search history.

(56) References Cited

U.S. PATENT DOCUMENTS

| | | | |
|---|---|---|---|
| 2008/0144685 A1* | 6/2008 | Tansu et al. | 372/45.011 |
| 2011/0012089 A1* | 1/2011 | Khan et al. | 257/13 |
| 2011/0089399 A1* | 4/2011 | Chakraborty et al. | 257/13 |

FOREIGN PATENT DOCUMENTS

| | | | |
|---|---|---|---|
| JP | 2001274457 A | 10/2001 |
| JP | 2001313421 A | 11/2001 |
| JP | 2003059948 A | 2/2003 |
| JP | 2003060212 A | 2/2003 |
| JP | 2005158846 A | 6/2005 |
| JP | 3978581 B | 7/2007 |
| JP | 4041908 B | 11/2007 |
| JP | 4058592 B | 12/2007 |
| JP | 4058593 B | 12/2007 |
| JP | 4058594 B | 12/2007 |

OTHER PUBLICATIONS

A. Dadgar et al., "Epitaxy of GaN LEDs on large substrates: Si or sapphire?" Advanced LEDs for Solid State Lighting, Proceedings of SPIE vol. 6355, 63550R, 2006, whole document.

* cited by examiner

*Primary Examiner* — Jose R Diaz
(74) *Attorney, Agent, or Firm* — Harness, Dickey & Pierce, P.L.C.

(57) ABSTRACT

A semiconductor device may reduce a dislocation density and tensile stress by forming a plurality of interlayers between neighboring clad layers. The semiconductor device may include a plurality of clad layers on a substrate and a plurality of interlayers between neighboring clad layers.

14 Claims, 3 Drawing Sheets

SEMICONDUCTOR DEVICE

CROSS-REFERENCE TO RELATED APPLICATIONS

This application claims the benefit of Korean Patent Application No. 10-2010-0039499, filed on Apr. 28, 2010, in the Korean Intellectual Property Office, the entire contents of which are incorporated herein by reference.

BACKGROUND

1. Field

Example embodiments relate to semiconductor devices, and more particularly, to semiconductor devices having reduced dislocation density and tensile stress.

2. Description of the Related Art

Many nitride-based semiconductor devices use a sapphire substrate. However, a sapphire substrate is costly, difficult to use in manufacturing chips, and has a lower electric conductivity. Also, a larger sized sapphire substrate may not be easily manufactured due to its warpage at a higher temperature and due to its lower heat conductivity in an epitaxial growing process. In order to prevent or reduce the above problems, nitride-based semiconductor devices using a silicon (Si) substrate instead of a sapphire substrate are being developed. Because a Si substrate has a higher heat conductivity than that of a sapphire substrate and thus does not warp as much at a higher temperature for growing a nitride thin film, a larger thin film may grown on the Si substrate.

However, when a nitride thin film grows on a Si substrate, a dislocation density may be increased due to a mismatch of lattice constants and cracks may be generated due to a mismatch of thermal expansion coefficients between the nitride thin film and the Si substrate. As a method of reducing a dislocation density, islands may be grown by using a SiNx dislocation reduction layer and then may be coalesced. However, because tensile stress is additionally generated while the islands are coalesced, a dislocation density may be reduced while cracks are increased. As described above, reducing both a dislocation density and cracks is difficult when a nitride thin film grows on a Si substrate that is vulnerable to tensile stress.

SUMMARY

Example embodiments provide semiconductor devices having reduced dislocation density and tensile stress. Additional aspects will be set forth in part in the description which follows and, in part, will be apparent from the description, or may be learned by practice of example embodiments.

According to example embodiments, a semiconductor device includes a plurality of clad layers on a substrate and a plurality of interlayers between neighboring clad layers of the plurality of clad layers.

The plurality of interlayers may include a first layer and a second layer formed of different materials and aligned alternately. The substrate may include at least one of a silicon (Si) substrate and a silicon carbide (SiC) substrate. Each of the plurality of clad layers may include a nitride semiconductor layer. Each of the plurality of clad layers may include a gallium nitride (GaN) layer.

The plurality of interlayers may include a first interlayer formed of $Al_{x0}In_{y0}Ga_{1-x0-y0}N$ ($0 \leq x0$, $y0 \leq 1$), and a second interlayer on the first interlayer, the second interlayer formed of a material including one selected from the group consisting of step-graded $Al_xIn_yGa_{1-x-y}N$ ($0 \leq x$, $y \leq 1$) and $Al_{x1}In_{y1}Ga_{1-x1-y1}N/Al_{x2}In_{y2}Ga_{1-x2-y2}N$ ($0 \leq x1$, $x2$, $y1$, $y2 \leq 1$, $x1 \neq x2$, $y1 \neq y2$) superlattice.

The semiconductor device may further include at least one buffer layer between the substrate and one clad layer of the plurality of clad layers closest to the substrate. The at least one buffer layer may include a first buffer layer formed of aluminum nitride (AlN), and a second buffer layer formed of a material including one selected from the group consisting of step-graded $Al_xIn_yGa_{1-x-y}N$ ($0 \leq x$, $y \leq 1$), AlN/GaN superlattice and a $Al_{x1}In_{y1}Ga_{1-x1-y1}N/Al_{x2}In_{y2}Ga_{1-x2-y2}N$ ($0 \leq x1$, $x2$, $y1$, $y2 \leq 1$, $x1 \neq x2$, $y1 \neq y2$) superlattice.

The at least one buffer layer may include a buffer layer formed of AlN. The at least one buffer layer may include a buffer layer formed of a $Al_{x1}In_{y1}Ga_{1-x1-y1}N/Al_{x2}In_{y2}Ga_{1-x2-y2}N$ ($0 \leq x1$, $x2$, $y1$, $y2 \leq 1$, $x1 \neq x2$, $y1 \neq y2$) superlattice. The superlattice may include at least two layers, and the uppermost layer of the at least two layers may function as one of the plurality of clad layers.

A molar ratio of aluminum (Al) may be reduced toward a top portion of the second interlayer formed of step-graded $Al_xIn_yGa_{1-x-y}N$ ($0 \leq x$, $y \leq 1$). An energy band may be reduced toward a top portion of the plurality of interlayers.

According to example embodiments, a semiconductor device may include a plurality of clad layers on a substrate, the plurality of clad layers including a gallium nitride (GaN) layer, and a plurality of interlayers between neighboring clad layers of the plurality of clad layers, wherein one interlayer of the plurality of interlayers is formed of $Al_{x0}In_{y0}Ga_{1-x0-y0}N$ ($0 \leq x0$, $y0 \leq 1$) and another interlayer of the plurality of interlayers is formed of a material including one selected from the group consisting of step-graded $Al_xIn_yGa_{1-x-y}N$ ($0 \leq x$, $y \leq 1$) and $Al_{x1}In_{y1}Ga_{1-x1-y1}N/Al_{x2}In_{y2}Ga_{1-x2-y2}N$ ($0 \leq x1$, $x2$, $y1$, $y2 \leq 1$, $x1 \neq x2$, $y1 \neq y2$) superlattice.

The substrate may be at least one of a silicon (Si) substrate and a silicon carbide (SiC) substrate. The semiconductor device may further include at least one buffer layer between the substrate and the clad layer of the plurality of clad layers closest to the substrate. The at least one buffer layer may include a first buffer layer formed of aluminum nitride (AlN) and a second buffer layer formed of a material including one selected from the group consisting of step-graded $Al_xIn_yGa_{1-x-y}N$ ($0 \leq x$, $y \leq 1$), AlN/GaN superlattice, and $Al_{x1}In_{y1}Ga_{1-x1-y1}N/Al_{x2}In_{y2}Ga_{1-x2-y2}N$ ($0 \leq x1$, $x2$, $y1$, $y2 \leq 1$, $x1 \neq x2$, $y1 \neq y2$) superlattice.

The at least one buffer layer may include a buffer layer formed of AlN. The at least one buffer layer may include a buffer layer formed of $Al_{x1}In_{y1}Ga_{1-x1-y1}N/Al_{x2}In_{y2}Ga_{1-x2-y2}N$ ($0 \leq x1$, $x2$, $y1$, $y2 \leq 1$, $x1 \neq x2$, $y1 \neq y2$) superlattice. The superlattice may include at least two layers, and the uppermost layer of the at least two layers may function as one of the plurality of clad layers.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
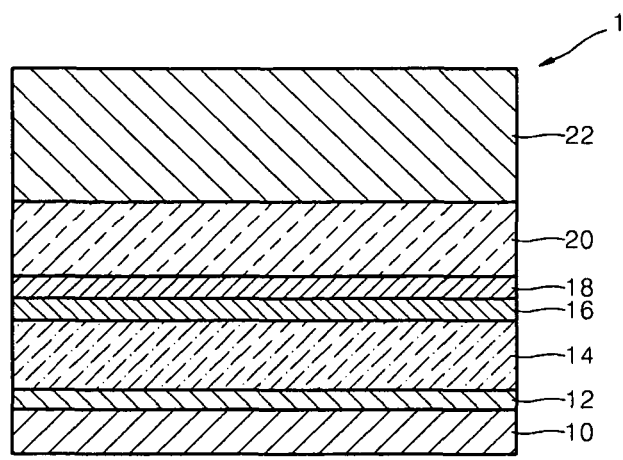
FIG. 1 is a cross-sectional view of a semiconductor device according to example embodiments.

Reference will now be made in detail to example embodiments, examples of which are illustrated in the accompanying drawings, wherein like reference numerals refer to like elements throughout and the size or thickness of each element may be enlarged for clarity. In this regard, example embodiments may have different forms and should not be construed as being limited to the descriptions set forth herein. Accordingly, example embodiments are merely described below, by referring to the figures, to explain the present description.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A semiconductor device according to example embodiments may reduce dislocations and tensile stress generated when a nitride thin film grows on a substrate by forming a plurality of interlayers between neighboring clad layers.

FIG. 1 is a cross-sectional view of a semiconductor device 1 according to example embodiments. Referring to FIG. 1, the semiconductor device 1 may include a substrate 10, and a plurality of clad layers formed on the substrate 10 described below. The substrate 10 may include at least one of a silicon (Si) substrate and a silicon carbide (SiC) substrate. A plurality of interlayers may be formed between neighboring clad layers. The clad layers may be at least one of an undoped clad layer, an n-type clad layer and a p-type clad layer, and may be formed as a nitride semiconductor layer.

The semiconductor device 1 may include a first clad layer 16 and a second clad layer 22 on the substrate 10. Each of the first and second clad layers 16 and 22 may be formed as a nitride semiconductor layer. The nitride semiconductor layer may be formed of a Group III nitride semiconductor material. For example, each of the first and second clad layers 16 and 22 may include a gallium nitride (GaN) layer. Also, a plurality of interlayers may be formed between the first and second clad layers 16 and 22. The plurality of interlayers may be formed of an aluminum (Al)-containing material and a molar ratio of Al may be reduced toward, for example, a top portion. However, the material and the molar ratio are not limited thereto.

The plurality of interlayers may include, for example, a first interlayer 18 and a second interlayer 20. The first interlayer 18 may be formed of, for example, $Al_{x0}In_{y0}Ga_{1-x0-y0}N$ ($0 \leq x0, y0 \leq 1$). The second interlayer 20 may be formed on the first interlayer 18 and may be formed of a material including one selected from the group consisting of step-graded $Al_{x0}Ga_{1-x0}N$ ($0 \leq x0 \leq 1$), step-graded $Al_xIn_yGa_{1-x-y}N$ ($0 \leq x, y \leq 1$), and $Al_{x1}In_{y1}Ga_{1-x1-y1}N/Al_{x2}In_{y2}Ga_{1-x2-y2}N$ ($0 \leq x1, x2, y1, y2 \leq 1$, $x1 \neq x2$, $y1 \neq y2$) superlattice. A step-graded layer may be formed by adjusting a composition ratio of a material for forming the layer by using at least one of a gradual and stepped method. In a step-graded layer, an energy band may be reduced toward a top portion. If the second interlayer 20 is formed as one of a step-graded layer and a superlattice layer, the second interlayer 20 may include a plurality of layers. In this structure, an interlayer including at least three layers may be formed between neighboring clad layers.

At least one buffer layer may be formed between the substrate 10 and one of the clad layers, which is the closest to the substrate 10, for example, between the substrate 10 and the first clad layer 16. The at least one buffer layer may include, for example, a first buffer layer 12 and a second buffer layer 14. The first buffer layer 12 may be formed of aluminum nitride (AlN), and the second buffer layer 14 may be formed of a material including one selected from the group consisting of step-graded $Al_xIn_yGa_{1-x-y}N$ ($0 \le x$, $y \le 1$), AlN/GaN superlattice, and $Al_{x1}In_{y1}Ga_{1-x1-y1}N/Al_{x2}In_{y2}Ga_{1-x2-y2}N$ ($0 \le x1$, $x2$, $y1$, $y2 \le 1$, $x1 \ne x2$, $y1 \ne y2$) superlattice.

The semiconductor device 1 may include the substrate 10, the first buffer layer 12 formed of AlN, the second buffer layer 14 formed of step-graded AlGaN, the first clad layer 16 formed of GaN, the first interlayer 18 formed of $Al_xIn_yGa_{1-x-y}N$ ($0 \le x$, $y \le 1$), the second interlayer 20 formed of step-graded $Al_{x1}Ga_{1-x1}N$ ($0 \le x1 \le 1$), and the second clad layer 22 formed of GaN.

Alternatively, the semiconductor device 1 may include the substrate 10, the first buffer layer 12 formed of AlN, the second buffer layer 14 formed of at least one of AlN/GaN superlattice and $Al_{x1}In_{y1}Ga_{1-x1-y1}N/Al_{x2}In_{y2}Ga_{1-x2-y2}N$ ($0 \le x1$, $x2$, $y1$, $y2 \le 1$, $x1 \ne x2$, $y1 \ne y2$) superlattice, the first clad layer 16 formed of GaN, the first interlayer 18 formed of $Al_xIn_yGa_{1-x-y}N$ ($0 \le x$, $y \le 1$), the second interlayer 20 formed of at least one of a AlN/GaN superlattice and $Al_{x1}In_{y1}Ga_{1-x1-y1}N/Al_{x2}In_{y2}Ga_{1-x2-y2}N$ ($0 \le x1$, $x2$, $y1$, $y2 \le 1$, $x1 \ne x2$, $y1 \ne y2$) superlattice, and the second clad layer 22 formed of GaN.

Alternatively, the semiconductor device 1 may include the substrate 10, the first buffer layer 12 formed of AlN, the second buffer layer 14 formed of at least one of an AlN/GaN superlattice and $Al_{x1}In_{y1}Ga_{1-x1-y1}N/Al_{x2}In_{y2}Ga_{1-x2-y2}N$ ($0 \le x1$, $x2$, $y1$, $y2 \le 1$, $x1 \ne x2$, $y1 \ne y2$) superlattice, the first clad layer 16 formed of GaN, the first interlayer 18 formed of $Al_xIn_yGa_{1-x-y}N$ ($0 \le x$, $y \le 1$, $x \ne y$), the second interlayer 20 formed of step-graded $Al_xGa_{1-x}N$ ($0 \le x \le 1$), and the second clad layer 22 formed of GaN.

Alternatively, the semiconductor device 1 may include the substrate 10, the first buffer layer 12 formed of AlN, the second buffer layer 14 formed of step-graded AlGaN, the first clad layer 16 formed of GaN, the first interlayer 18 formed of $Al_xIn_yGa_{1-x-y}N$ ($0 \le x$, $y \le 1$, $x \ne y$), the second interlayer 20 formed of at least one of AlN/GaN superlattice and $Al_{x1}In_{y1}Ga_{1-x1-y1}N/Al_{x2}In_{y2}Ga_{1-x2-y2}N$ ($0 \le x1$, $x2$, $y1$, $y2 \le 1$, $x1 \ne x2$, $y1 \ne y2$) superlattice, and the second clad layer 22 formed of GaN.

Figure 2:
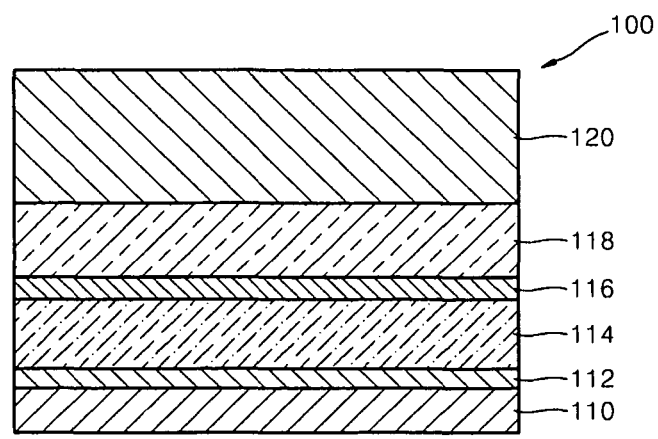
FIG. 2 is a cross-sectional view of a semiconductor device according to example embodiments.

A semiconductor device 100 illustrated in FIG. 2 may include a substrate 110, a first clad layer 114 and a second clad layer 120 formed on the substrate 110, and a first interlayer 116 and a second interlayer 118 formed between the first and second clad layers 114 and 120. The substrate 110 may include at least one of Si substrate and a SiC substrate. The first interlayer 116 may be formed of $Al_xIn_yGa_{1-x-y}N$ ($0 \le x$, $y \le 1$, $x \ne y$), and the second interlayer 118 may be formed of at least one of step-graded $Al_xGa_{1-x}N$ ($0 \le x \le 1$) and step-graded $Al_xIn_yGa_{1-x-y}N$ ($0 \le x$, $y \le 1$). The first interlayer 116 may generate compressive stress in a grown thin film, and the second interlayer 118 may reduce lattice dislocations. A buffer layer 112 may be formed between the substrate 110 and the first clad layer 114. The buffer layer 112 may be formed of AlN.

Figure 3:
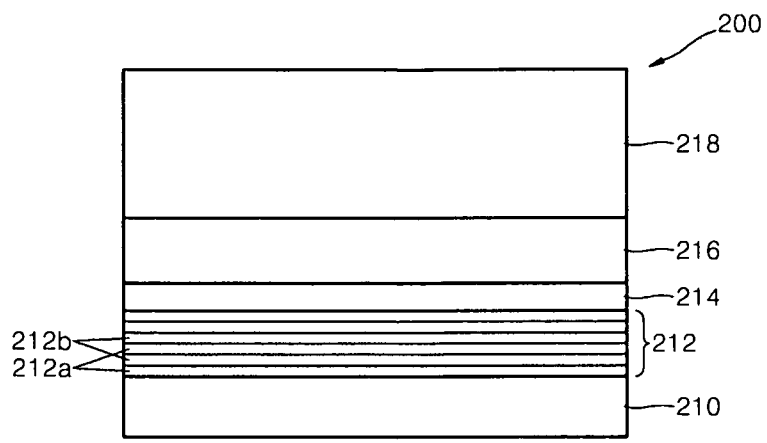
FIG. 3 is a cross-sectional view of a semiconductor device according to example embodiments.

A semiconductor device 200 illustrated in FIG. 3 may include a substrate 210, a superlattice layer 212 formed on the substrate 210, a first interlayer 214 and a second interlayer 216 formed on the superlattice layer 212, and a clad layer 218 formed on the second interlayer 216. The superlattice layer 212 may include, for example, at least one of an AlN/GaN superlattice layer and an $Al_{x1}In_{y1}Ga_{1-x1-y1}N/Al_{x2}In_{y2}Ga_{1-x2-y2}N$ ($0 \le x1$, $x2$, $y1$, $y2 \le 1$, $x1 \ne x2$, $y1 \ne y2$) superlattice. The superlattice layer 212 includes a first layer 212a and a second layer 212b stacked alternately and, for example, the AlN/GaN superlattice layer may include an AlN layer and a GaN layer aligned alternately. Because the superlattice layer 212 functions as a buffer layer and includes a GaN layer as a top layer, the superlattice layer 212 may not include an additional clad layer thereon.

However, the superlattice layer 212 may include an additional clad layer thereon. The first and second interlayers 214 and 216 may be formed between the clad layer 218 and the GaN layer that is a top layer of the superlattice layer 212. The first interlayer 214 may be formed of $Al_xIn_yGa_{1-x-y}N$ ($0 \le x$, $y \le 1$, $x \ne y$), and the second interlayer 216 may be formed of at least one of step-graded $Al_xGa_{1-x}N$ ($0 \le x \le 1$), step-graded $Al_xIn_yGa_{1-x-y}N$ ($0 \le x$, $y \le 1$), AlN/GaN superlattice and $Al_{x1}In_{y1}Ga_{1-x1-y1}N/Al_{x2}In_{y2}Ga_{1-x2-y2}N$ ($0 \le x1$, $x2$, $y1$, $y2 \le 1$, $x1 \ne x2$, $y1 \ne y2$) superlattice. If the superlattice layer 212 includes an $Al_{x1}In_{y1}Ga_{1-x1-y1}N/Al_{x2}In_{y2}Ga_{1-x2-y2}N$ ($0 \le x1$, $x2$, $y1$, $y2 \le 1$, $x1 \ne x2$, $y1 \ne y2$) superlattice layer, because an $Al_{x1}In_{y1}Ga_{1-x1-y1}N$ layer and an $Al_{x2}In_{y2}Ga_{1-x2-y2}N$ layer having different composition ratios are stacked alternately and the $Al_{x2}In_{y2}Ga_{1-x2-y2}N$ layer may function as a clad layer, a clad layer may not be separately formed.

Figure 4:
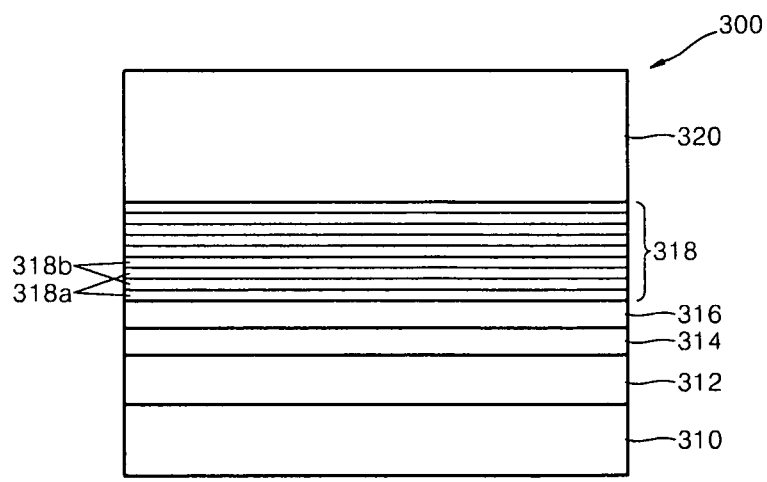
FIG. 4 is a cross-sectional view of a semiconductor device according to example embodiments.

A semiconductor device 300 illustrated in FIG. 4 may include a substrate 310, a buffer layer 312 formed on the substrate 310, a first clad layer 314 formed on the buffer layer 312, a first interlayer 316 and a second interlayer 318 formed on the first clad layer 314, and a second clad layer 320 formed on the second interlayer 318. The substrate 310 may include at least one of Si substrate and a SiC substrate. The buffer layer 312 may be formed of at least one of step-graded $Al_xGa_{1-x}N$ ($0 \le x \le 1$) and step-graded $Al_xIn_yGa_{1-x-y}N$ ($0 \le x$, $y \le 1$, $x \ne y$), and each of the first and second clad layers 314 and 320 may include a nitride semiconductor layer, e.g., a GaN layer. The first interlayer 316 may be formed of $Al_xIn_yGa_{1-x-y}N$ ($0 \le x$, $y \le 1$, $x \ne y$), and the second interlayer 318 may include a first layer 318a and a second layer 318b formed of different materials and aligned alternately. The second interlayer 318 may be formed as at least one of an AlN/GaN superlattice layer and an $Al_{x1}In_{y1}Ga_{1-x1-y1}N/Al_{x2}In_{y2}Ga_{1-x2-y2}N$ ($0 \le x1$, $x2$, $y1$, $y2 \le 1$, $x1 \ne x2$, $y1 \ne y2$) superlattice layer.

Figure 5:
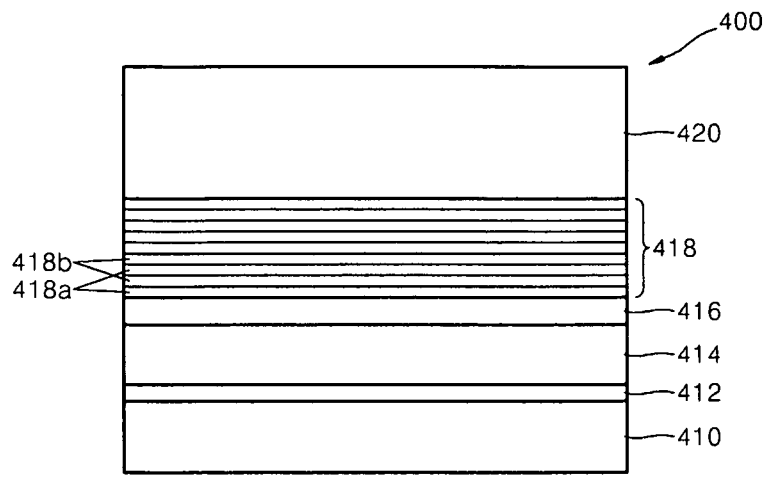
FIG. 5 is a cross-sectional view of a semiconductor device according to example embodiments.

A semiconductor device 400 illustrated in FIG. 5 may include a substrate 410, a buffer layer 412 formed of AlN, a first clad layer 414, a first interlayer 416, a second interlayer 418, and a second clad layer 420. The substrate 410 may include at least one of a Si substrate and a SiC substrate. The first interlayer 416 may be formed of $Al_xIn_yGa_{1-x-y}N$ ($0 \le x$, $y \le 1$), and the second interlayer 418 may include a first layer 418a and a second layer 418b aligned alternately. The second interlayer 418 may be formed as at least one of an AlN/GaN superlattice layer and an $Al_{x1}In_{y1}Ga_{1-x1-y1}N/Al_{x2}In_{y2}Ga_{1-x2-y2}N$ ($0 \le x1$, $x2$, $y1$, $y2 \le 1$, $x1 \ne x2$, $y1 \ne y2$) superlattice layer. According to example embodiments, lattice dislocations and tensile stress may be reduced by forming a plurality of interlayers between neighboring clad layers.

Figure 6:
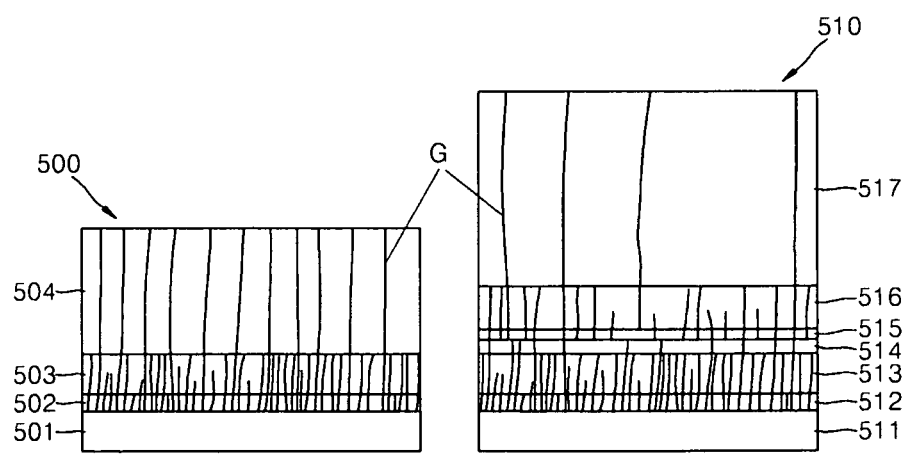
FIG. 6 is a diagram for comparing a semiconductor device having no interlayer, according to a comparative example, and a semiconductor device including a plurality of interlayers, according to example embodiments.

FIG. 6 is a diagram for comparing a first semiconductor device 500 including a buffer layer, and a second semiconductor device 510 including a buffer layer and a plurality of interlayers. Referring to FIG. 6, the first semiconductor device 500 includes a Si substrate 501, and an AlN layer 502, an AlGaN layer 503, and a GaN layer 504 which are stacked on the Si substrate 501. The second semiconductor device 510 includes a Si substrate 511, and a first AlN layer 512, an $Al_xGa_{1-x}N$ ($0 \le x \le 1$) layer 513, a first GaN layer 514, a first interlayer 515 formed as a second AlN layer, a second interlayer 516 formed as an $Al_xGa_{1-x}N$ ($0 \leq x \leq 1$) layer, and a second GaN layer 517 which are stacked on the Si substrate 511.

When the AlN layer 502 or 512 and the AlGaN layer 503 or 513 are grown on the Si substrate 501 or 511, compressive stress is applied. If the GaN layer 504 or 514 grows on the AlGaN layer 503 or 513, dislocations on an interface between the AlGaN layer 503 or 513 and the GaN layer 504 or 514 may be reduced. If a GaN thin film additionally grows on the GaN layer 504 or 514, the compressive stress may be transformed into tensile stress in some portions. If the compressive stress is transformed into the tensile stress, cracks may be generated when clad layers are cooled. The compressive stress may be maintained by inserting the first and second interlayers 515 and 516 into the portions where the compressive stress is transformed into the tensile stress. As such, the cracks due to the tensile stress may be reduced. Also, although dislocations G may be generated between the first and second interlayers 515 and 516, a density of the dislocations G generated on an interface therebetween is less than that generated on a Si/AlN interface, and the dislocations may be bent in an AlGaN layer or may form half loops to disappear. Accordingly, the dislocations G are reduced on an interface between the second interlayer 516 and the second GaN layer 517, and the number of dislocations G that propagate upward may be reduced.

As described above, if a plurality of interlayers are formed between neighboring clad layers, island coalescence may not occur such that tensile stress may not be generated, and compressive stress may be maintained. As such, a dislocation density and tensile stress may be reduced together.

A semiconductor device according to example embodiments may include a nitride thin film grown on at least one of a Si substrate and a SiC substrate to a desired thickness by reducing lattice dislocations and tensile stress together. Also, a relatively large wafer may be manufactured by using at least one of a Si substrate and a SiC substrate. The semiconductor device may be used in at least one of a light-emitting diode and a power device.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A semiconductor device, comprising:
a plurality of clad layers on a substrate;
a plurality of interlayers between neighboring clad layers of the plurality of clad layers,
wherein the plurality of interlayers include:
a first interlayer formed of $Al_{x0}In_{y0}Ga_{1-x0-y0}N$ ($0 \leq x0 \leq 1$, $0 \leq y0 \leq 1$); and
a second interlayer on the first interlayer, the second interlayer formed of a material including one selected from the group consisting of step-graded $Al_xIn_yGa_{1-x-y}N$ ($0 \leq x \leq 1$, $0 \leq y \leq 1$) and $Al_{x1}In_{y1}Ga_{1-x1-y1}N/Al_{x2}In_{y2}Ga_{1-x2-y2}N$ ($0 \leq x1 \leq 1$, $0 \leq x2 \leq 1$, $0 \leq y1 \leq 1$, $0 \leq y2 \leq 1$, $x1 \neq x2$, $y1 \neq y2$) superlattice; and
wherein a molar ratio of aluminum (Al) is reduced toward a top portion of the second interlayer formed of step-graded $Al_xIn_yGa_{1-x-y}N$ ($0 \leq x \leq 1$, $0 \leq y \leq 1$).

2. The semiconductor device of claim 1, wherein the plurality of interlayers include a first layer and a second layer formed of different materials and aligned alternately.

3. The semiconductor device of claim 1, wherein the substrate is at least one of a silicon (Si) substrate and a silicon carbide (SiC) substrate.

4. The semiconductor device of claim 1, wherein each of the plurality of clad layers includes a nitride semiconductor layer.

5. The semiconductor device of claim 4, wherein each of the plurality of clad layers includes a gallium nitride (GaN) layer.

6. The semiconductor device of claim 1, further comprising:
at least one buffer layer between the substrate and the clad layer of the plurality of clad layers closest to the substrate.

7. The semiconductor device of claim 6, wherein the at least one buffer layer comprises:
a first buffer layer formed of aluminum nitride (AlN); and
a second buffer layer formed of a material including one selected from the group consisting of step-graded $Al_xIn_yGa_{1-x-y}N$, ($0 \leq x \leq 1$, $0 \leq y \leq 1$) AlN/GaN superlattice, and $Al_{x1}In_{y1}Ga_{1-x1-y1}N/Al_{x2}In_{y2}Ga_{1-x2-y2}N$ ($0 \leq x1 \leq 1$, $0 \leq x2 \leq 1$, $0 \leq y1 \leq 1$, $0 \leq y2 \leq 1$, $x1 \neq x2$, $y1 \neq y2$) superlattice.

8. The semiconductor device of claim 6, wherein the at least one buffer layer comprises a buffer layer formed of AlN.

9. The semiconductor device of claim 6, wherein the at least one buffer layer comprises a buffer layer formed of a $Al_{x1}In_{y1}Ga_{1-x1-y1}N/Al_{x2}In_{y2}Ga_{1-x2-y2}N$ ($0 \leq x1 \leq 1$, $0 \leq x2 \leq 1$, $0 \leq y1 \leq 1$, $0 \leq y2 \leq 1$, $x1 \neq x2$, $y1 \neq y2$) superlattice.

10. The semiconductor device of claim 9, wherein the superlattice includes at least two layers, and the uppermost layer of the at least two layers functions as one of the plurality of clad layers.

11. The semiconductor device of claim 1, wherein an energy band is reduced toward a top portion of the plurality of interlayers.

12. A semiconductor device, comprising:
a plurality of clad layers on a substrate, the plurality of clad layers including a gallium nitride (GaN) layer;
a plurality of interlayers between neighboring clad layers of the plurality of clad layers,
wherein one interlayer of the plurality of interlayers is formed of $Al_{x0}In_{y0}Ga_{1-x0-y0}N$ ($0 \leq x0 \leq 1$, $0 \leq y0 \leq 1$) and another interlayer of the plurality of interlayers is formed of a material including one selected from the group consisting of step-graded $Al_xIn_yGa_{1-x-y}N$ ($0 \leq x \leq 1$, $0 \leq y \leq 1$) and $Al_{x1}In_{y1}Ga_{1-x1-y1}N/Al_{x2}In_{y2}Ga_{1-x2-y2}N$ ($0 \leq x1 \leq 1$, $0 \leq x2 \leq 1$, $0 \leq y1 \leq 1$, $0 \leq y2 \leq 1$, $x1 \neq x2$, $y1 \neq y2$) superlattice; and
at least one buffer layer between the substrate and the clad layer of the plurality of clad layers closest to the substrate,
wherein the at least one buffer layer includes a buffer layer formed of $Al_{x1}In_{y1}Ga_{1-x1-y1}N/Al_{x2}In_{y2}Ga_{1-x2-y2}N$ ($0 \leq x1 \leq 1$, $0 \leq x2 \leq 1$, $0 \leq y1 \leq 1$, $0 \leq y2 \leq 1$, $x1 \neq x2$, $y1 \neq y2$) superlattice.

13. The semiconductor device of claim 12, wherein the substrate is at least one of a silicon (Si) substrate and a silicon carbide (SiC) substrate.

14. The semiconductor device of claim 12, wherein the superlattice includes at least two layers, and the uppermost layer of the at least two layers functions as one of the plurality of clad layers.

* * * * *